United States Patent
Kakuyama et al.

(10) Patent No.: US 12,439,822 B2
(45) Date of Patent: Oct. 7, 2025

(54) OPTICAL SENSOR

(71) Applicant: Sumitomo Electric Industries, Ltd., Osaka (JP)

(72) Inventors: Kyohei Kakuyama, Osaka (JP); Kotaro Hirose, Osaka (JP); Masahiro Adachi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 76 days.

(21) Appl. No.: 18/377,306

(22) Filed: Oct. 6, 2023

(65) Prior Publication Data

US 2024/0130238 A1 Apr. 18, 2024

(30) Foreign Application Priority Data

Oct. 11, 2022 (JP) .................. 2022-163220

(51) Int. Cl.
*H01L 35/00* (2006.01)
*G01J 5/12* (2006.01)
(Continued)

(52) U.S. Cl.
CPC ............ *H10N 10/8556* (2023.02); *G01J 5/12* (2013.01); *H10N 10/13* (2023.02); *H10N 10/817* (2023.02)

(58) Field of Classification Search
CPC .. H10N 10/8556; H10N 10/13; H10N 10/817; H10N 10/17; G01J 5/12; G01J 5/046; G01J 5/0853
See application file for complete search history.

(56) References Cited

U.S. PATENT DOCUMENTS 6,339,187 B1 * 1/2002 Inoue .................... C23C 14/081
136/225
6,348,650 B1 * 2/2002 Endo ........................ G01J 5/12
136/224
(Continued)

FOREIGN PATENT DOCUMENTS

JP 2017-223644 A 12/2017
WO 2021/039074 A1 3/2021

OTHER PUBLICATIONS

Tambo et al., "Sensitivity improved thermal infrared sensor cell applying the heat insulating phononic crystals", Image Sensing Technologies: Materials, Devices, Systems, and Applications VIII. Proc. of SPIE vol. 11723. International Society for Optics and Photonics, 2021, pp. 1172306-1-1172306-8.

*Primary Examiner* — Thanh Truc Trinh
(74) *Attorney, Agent, or Firm* — XSENSUS LLP

(57) ABSTRACT

An optical sensor includes a support film having a first main surface and a second main surface located opposite to the first main surface in a thickness direction; a thermoelectric-conversion material section disposed on the first main surface and including a plurality of strip-shaped first material layers formed of SiGe having p-type conductivity and configured to convert thermal energy into electric energy, and a plurality of strip-shaped second material layers formed of SiGe having n-type conductivity and configured to convert thermal energy into electric energy; a heat sink disposed on the second main surface; and a light absorbing film disposed so as to form a temperature difference in each of the first material layers in longitudinal directions and each of the second material layers in longitudinal directions and configured to convert received light into thermal energy.

18 Claims, 11 Drawing Sheets

(51) Int. Cl.
  *H10N 10/13*  (2023.01)
  *H10N 10/817*  (2023.01)
  *H10N 10/851*  (2023.01)

(56) References Cited

U.S. PATENT DOCUMENTS

| | | | |
|---|---|---|---|
| 9,006,857 B1* | 4/2015 | Carr | G01J 5/12 |
| | | | 257/209 |
| 2002/0069909 A1* | 6/2002 | Kubo | G01J 5/12 |
| | | | 136/224 |
| 2010/0186794 A1* | 7/2010 | Chen | F24S 50/20 |
| | | | 136/206 |
| 2017/0356806 A1 | 12/2017 | Takahashi et al. | |
| 2022/0399485 A1 | 12/2022 | Adachi et al. | |

* cited by examiner

OPTICAL SENSOR

CROSS-REFERENCE TO RELATED APPLICATION

This application claims priority based on Japanese Patent Application No. 2022-163220, filed on Oct. 11, 2022, the entire contents of which are incorporated herein by reference.

TECHNICAL FIELD

The present disclosure relates to an optical sensor.

BACKGROUND

Thermoelectric conversion elements including thermoelectric conversion materials formed of compound semiconductors are known (see, for example, International Publication No. 2021/039074 and Japanese Patent Application Laid-Open No. 2017-223644). In addition, infrared sensors using a phononic structure are known (for example, see Tambo, Naoki, et al. "Sensitivity improved thermal infrared sensor cell applying the heat insulating phononic crystals." Image Sensing Technologies: Materials, Devices, Systems, and Applications VIII. Vol. 11723. International Society for Optics and Photonics, 2021).

SUMMARY

An optical sensor according to the present disclosure includes a support film having a first main surface and a second main surface located opposite to the first main surface in a thickness direction; a thermoelectric-conversion material section disposed on the first main surface and including a plurality of first material layers and a plurality of second material layers; a heat sink disposed on the second main surface; and a light absorbing film. Each of the plurality of first material layers has a strip shape, is formed of SiGe having p-type conductivity, and is configured to convert thermal energy into electric energy. Each of the plurality of second material layers has a strip shape, is formed of SiGe having n-type conductivity, and is configured to convert thermal energy into electric energy. The light absorbing film is disposed so as to form a temperature difference in each of the first material layers in longitudinal directions and each of the second material layers in longitudinal directions as viewed in a direction perpendicular to the first main surface and configured to convert received light into thermal energy. The plurality of first material layers and the plurality of second material layers are formed of a first phononic structure having a large number of pores.

DETAILED DESCRIPTION

Figure 1:
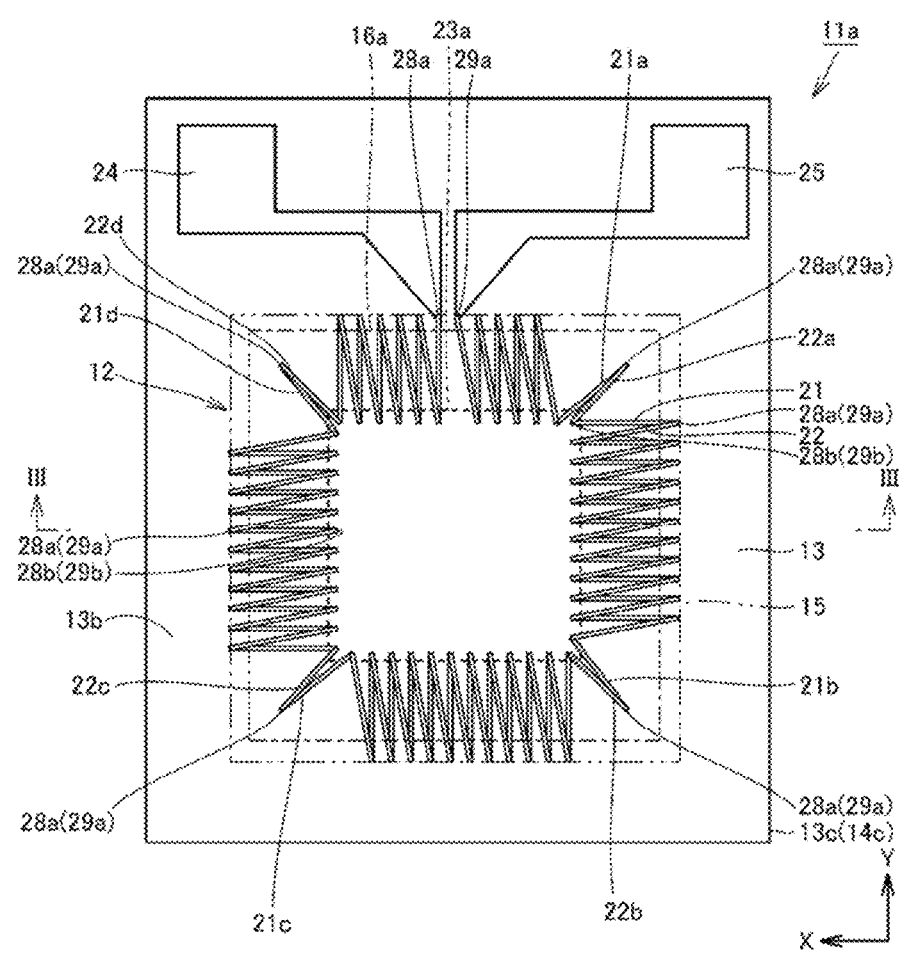
FIG. 1 is a schematic plan view of an appearance of an optical sensor according to a first embodiment.

When an optical sensor is used as, for example, an infrared sensor, it is required to have a good noise equivalent power (NEP), that is, a low value thereof. Accordingly, an object of the present disclosure is to provide an optical sensor in which the noise equivalent power can be reduced.

First, embodiments of the present disclosure will be listed and described.

(1) An optical sensor according to the present disclosure includes a support film having a first main surface and a second main surface located opposite to the first main surface in a thickness direction; a thermoelectric-conversion material section disposed on the first main surface and including a plurality of first material layers and a plurality of second material layers; a heat sink disposed on the second main surface; and a light absorbing film. Each of the plurality of first material layers has a strip shape, is formed of SiGe having p-type conductivity, and is configured to convert thermal energy into electric energy. Each of the plurality of second material layers has a strip shape, is formed of SiGe having n-type conductivity, and is configured to convert thermal energy into electric energy. The light absorbing film is disposed so as to form a temperature difference in each of the first material layers in longitudinal directions and each of the second material layers in longitudinal directions as viewed in a direction perpendicular to the first main surface and configured to convert received light into thermal energy. The plurality of first material layers and the plurality of second material layers are formed of a first phononic structure having a large number of pores.

A thermopile-type optical sensor using a thermoelectric conversion material that converts a temperature difference (thermal energy) into electric energy, such as an infrared sensor, may include a light absorbing film that is configured to convert optical energy into thermal energy, and a thermoelectric-conversion material section (thermopile) that is configured to convert thermal energy into electric energy. In the thermoelectric-conversion material section, for example, a thermocouple may be used which a thermoelectric conversion material having n-type conductivity, which is a first conductivity type, and a thermoelectric conversion material having p-type conductivity, which is a second conductivity type different from the first conductivity type, are connected to each other to form. A plurality of n-type thermoelectric conversion materials having a strip shape and a plurality of p-type thermoelectric conversion materials having a strip shape are alternately connected to each other in series to increase an output.

Here, when the optical sensor is used as, for example, an infrared sensor, it is required to have a good noise equivalent power (NEP), which is an important indicator, that is, a low value thereof. The NEP is expressed as a noise divided by a sensitivity (NEP=noise/sensitivity). The sensitivity of the optical sensor is expressed by the following equation shown in Math. 1.

$$D* = \frac{\eta \times n \times \alpha}{Gth} \quad [\text{Math. 1}]$$

D* represents a sensitivity, q represents an emissivity, n represents the number of pairs of thermocouples, α represents a Seebeck coefficient, and Gth represents a thermal conductance. As can be understood from the above equation, the sensitivity of the optical sensor can be improved by reducing the thermal conductance.

The noise in the optical sensor is expressed by the following equation shown in Math. 2.

$$V_n = (4k \times T \times R \times \Delta f)^{1/2} \quad [\text{Math. 2}]$$

Vn represents a noise (Johnson noise) (V), k represents a Boltzmann constant (J/K), T represents a temperature (K), R represents a resistance (Ω), and Δf represents a bandwidth (Hz=1/s). As can be understood from the above equation (2), the Johnson noise depends on the resistance, so that the noise in the optical sensor can be reduced by reducing the resistance.

In order to improve the NEP, that is, to reduce the NEP, the inventors of the present disclosure have considered to reduce the noise of the optical sensor and increase the sensitivity of the optical sensor. Then, the present inventors have found that it is difficult to increase the sensitivity because of a high thermal conductivity of a material layer that is included in a thermoelectric-conversion material section and converts thermal energy into electric energy among components included in the optical sensor. Accordingly, the present inventors have focused on reducing the thermal conductivity of the material layer, and have arrived at the configuration of the present disclosure.

In the optical sensor according to the present disclosure, the plurality of first material layers and the plurality of second material layers are formed of a first phononic structure having a large number of pores. According to such a configuration, the thermal conductivities of the first material layers and the second material layers can be reduced. Thus, the sensitivity of the optical sensor can be increased. As a result, according to such an optical sensor, the noise equivalent power can be reduced. Here, the first phononic structure refers to a structure that has a periodic structure on the order of nanometers to several microns and artificially obstructs phonon propagation. The first phononic structure in the present disclosure is a structure having a plurality of regularly arranged through holes. However, the through holes may include a hole having a film residue.

(2) In the above (1), the support film may be formed of a second phononic structure having a large number of pores. In this manner, it is possible to reduce the thermal conductivity of the support film in addition to thermal conductivities of the first material layers and the second material layers. Thus, the sensitivity can be increased. As a result, according to such an optical sensor, the noise equivalent power can be reduced.

(3) In the above (1) or (2), when a pitch interval of the pores forming the first phononic structure is a length D1 and a diameter of the pores forming the first phononic structure is a length D2, a difference between the length D1 and the length D2 may be 5 nm to 500 nm. In this manner, the thermal conductance is reduced to increase the sensitivity while the resistances and the contact resistances of the first material layers and the second material layers themselves can be properly balanced to reduce the noise. As a result, according to such an optical sensor, the noise equivalent power can be further reduced.

(4) In the above (3), a difference between length D1 and length D2 may be 10 nm to 200 nm. In this manner, the noise equivalent power can be further reduced.

(5) In any one of the above (1) to (4), a pitch interval of the pores forming the first phononic structure may be 20 nm to 1200 nm. In this manner, the thermal conductivity in the first phononic structure can be more reliably reduced. Therefore, the sensitivity of the optical sensor can be increased to further reduce the noise equivalent power.

(6) In any one of the above (1) to (5), a diameter of the pores forming the first phononic structure may be 15 nm to 200 nm. In this manner, the thermal conductivity in the first phononic structure can be more reliably reduced. Therefore, the sensitivity of the optical sensor can be increased to further reduce the noise equivalent power.

(7) In any one of the above (1) to (6), the optical sensor may further include an underlying film disposed between the thermoelectric-conversion material section and the light absorbing film. In this manner, the first phononic structure can be easily formed in the first material layers and the second material layers, so that productivity can be improved.

(8) In the above (7), a thickness of the underlying film may be 10 nm to 50 nm. In this manner, both reduction in the noise equivalent power of the optical sensor and good productivity thereof can be achieved more reliably.

(9) In the above (2), a pitch interval of the pores and a diameter of the pores forming the first phononic structure may be the same as a pitch interval of the pores and a diameter of the pores forming the second phononic structure, respectively. In this manner, after the support film, the first material layers, and the second material layers are formed, the first phononic structure and the second phononic structure can be formed at a time. Therefore, productivity can be improved.

(10) In any one of (1) to (9), the SiGe may have at least one of a nanocrystal structure having a grain size of 3 nm to 200 nm or an amorphous structure. In this manner, a thermoelectric conversion efficiency can be improved. Therefore, the sensitivity can be improved and the noise equivalent power can be reduced.

(11) In any one of the above (1) to (9), the SiGe may be polycrystal. SiGe which is such a polycrystal is also suitably utilized in the optical sensor of the present disclosure. A crystallization rate of the polycrystal in the optical sensor of the present disclosure is 99% or more.

(12) In any one of (1) to (11), first overlapping portions of the plurality of first material layers overlapping the light absorbing film, second overlapping portions of the plurality of second material layers overlapping the light absorbing film, or both the first overlapping portions and the second overlapping portions may be formed of the first phononic structure. In this manner, a thermal conductivity in portions where the first material layers and the second material layers overlap the light absorbing film can be reduced to increase the sensitivity, so that the noise equivalent power can be reduced.

(13) In any one of (1) to (11), first overlapping portions of the plurality of first material layers overlapping the light absorbing film and second overlapping portions of the plurality of second material layers overlapping the light absorbing film may not have the first phononic structure. This can improve productivity since the formation of the light absorbing film is not affected by the phononic structure.

DETAILS OF EMBODIMENTS OF PRESENT DISCLOSURE

Next, embodiments of the optical sensor according to the present disclosure will be described with reference to the drawings. In the following drawings, the same or corresponding portions are denoted by the same reference numerals, and description thereof will be omitted.

First Embodiment

Figure 2:
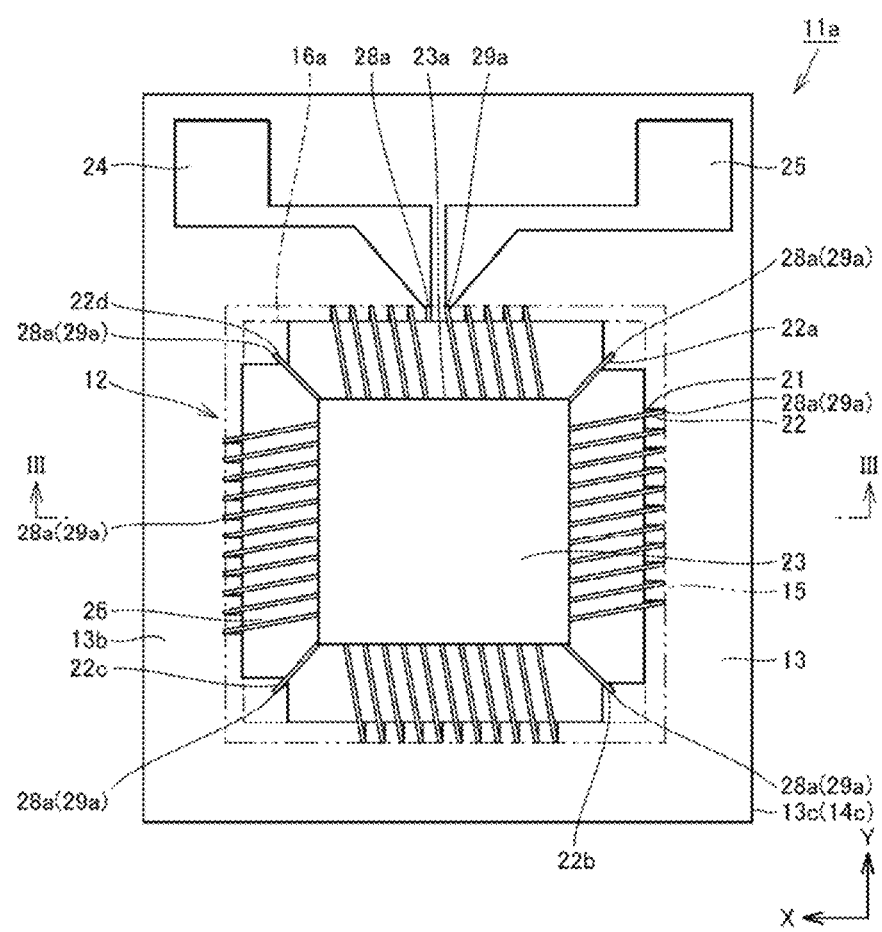
FIG. 2 is a schematic plan view of an appearance of the optical sensor according to the first embodiment.
Figure 3:
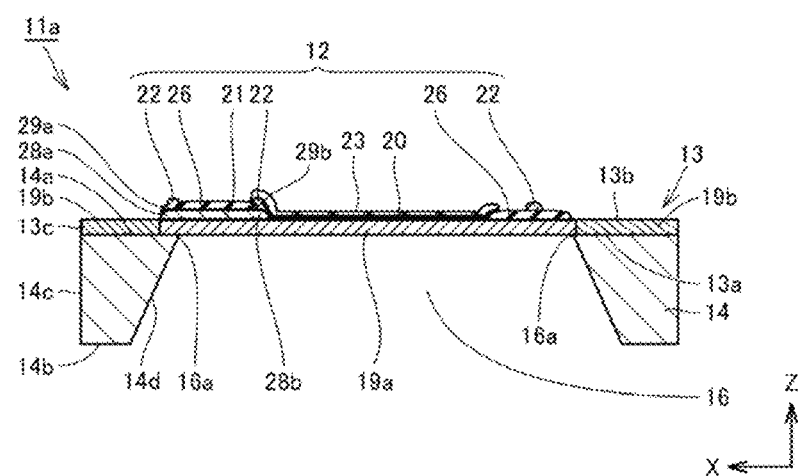
FIG. 3 is a schematic cross-sectional view taken along line III-III of FIGS. 1 and 2.
Figure 4:
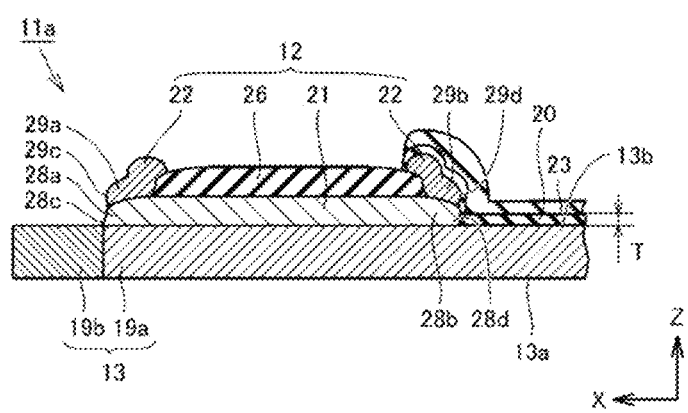
FIG. 4 is a schematic cross-sectional view of a portion of the optical sensor according to the first embodiment.

An optical sensor according to a first embodiment of the present disclosure will be described. FIGS. 1 and 2 are schematic plan views of an appearance of the optical sensor in the first embodiment. For ease of understanding, an infrared absorbing film and an insulating film, which will be described later, are not shown in FIG. 1. In FIG. 1, an outer edge 23a where the infrared absorbing film is to be disposed is indicated by a dashed line. FIG. 3 is a schematic cross-sectional view taken along line III-III of FIGS. 1 and 2. FIG. 4 is a schematic cross-sectional view of a portion of the optical sensor in the first embodiment. FIG. 4 is an enlarged schematic cross-sectional view of a portion including a first region, a second region, a third region, and a fourth region to be described later.

Referring to FIGS. 1, 2, 3 and 4, an optical sensor 11a is, for example, an infrared sensor. Optical sensor 11a includes a support film 13, a thermoelectric-conversion material section 12, a heat sink 14, an infrared absorbing film 23 as a light absorbing film, a first electrode 24, and a second electrode 25. Optical sensor 11a detects a potential difference generated between first electrode 24 and second electrode 25 to detect an infrared ray irradiated to optical sensor 11a. In a case where entire optical sensor 11a is plate-shaped, a thickness direction thereof is represented by a Z direction. A direction perpendicular to the surfaces of the papers of FIGS. 1 and 2 is the Z direction.

In the present embodiment, support film 13 has a rectangular shape as viewed in the thickness direction (Z direction) of support film 13. Support film 13 supports thermoelectric-conversion material section 12, infrared absorbing film 23, first electrode 24, and second electrode 25. Support film 13 includes a first main surface 13b located on one side in the thickness direction and a second main surface 13a located on the other side in the thickness direction. Other configurations of support film 13 will be described in detail later.

Heat sink 14 includes a first surface 14a and a second surface 14b spaced apart from each other in the thickness direction of optical sensor 11a. Heat sink 14 is disposed on second main surface 13a of support film 13. Specifically, heat sink 14 is disposed such that first surface 14a of heat sink 14 and second main surface 13a of support film 13 are in contact with each other. Second surface 14b of heat sink 14 is exposed. In the present embodiment, heat sink 14 has an annular shape. An outer edge 14c of entire heat sink 14 and an outer edge 13c of support film 13 extend contiguously in the Z direction. Heat sink 14 is represented as two trapezoids spaced apart in the X direction in the cross-section shown in FIG. 3. Heat sink 14 is sufficiently thicker than support film 13. For example, a thickness of heat sink 14 is 10 times or more the thickness of support film 13. In the present embodiment, heat sink 14 is a so-called substrate. Heat sink 14 is formed of, for example, silicon (Si).

A recess 16 which is concave in the thickness direction is formed in optical sensor 11a. In a region corresponding to recess 16 as viewed from aside of second surface 14b in the thickness direction, support film 13, specifically, second main surface 13a of support film 13 is exposed. In FIG. 1, an inner edge 16a of heat sink 14, which is a boundary between heat sink 14 and support film 13 as viewed in the Z direction, is indicated by a one-dot chain line in FIG. 1. As shown in FIG. 1, in the present embodiment, inner edge 16a of heat sink 14 has a square shape as viewed in the Z direction. Heat sink 14 is disposed so as to surround recess 16. An inner peripheral surface 14d of the heat sink surrounding recess 16 has a so-called tapered shape in which an opening is wider at a position closer to second surface 14b of heat sink 14. Recess 16 is formed by, for example, anisotropic wet etching of a flat plate-like substrate. Such recess 16 is formed to suppress heat escape from infrared absorbing film 23 to heat sink 14. Therefore, it is possible to further increase a temperature difference in each of first material layers 21 in longitudinal directions and each of second material layers 22 in longitudinal directions to be described later.

First electrode 24 and second electrode 25 are disposed on first main surface 13b of support film 13 outside a region 15 to be described later. Second electrode 25 is disposed so as to be spaced apart from first electrode 24. First electrode 24 and second electrode 25 are, for example, pad electrodes. Materials used for first electrode 24 and second electrode 25 includes, for example, gold (Au), titanium (Ti), platinum (Pt) and the like.

Thermoelectric-conversion material section 12 is disposed on first main surface 13b of support film 13. Thermoelectric-conversion material section 12 includes a plurality of first material layers 21 including first material layers 21a, 21b, 21c, and 21d and a plurality of second material layers 22 including second material layers 22a, 22b, 22c, and 22d. Each of first material layers 21 and second material layers 22 included in thermoelectric-conversion material section 12 is formed of SiGe. That is, each of first material layers 21 and second material layers 22 is formed of a compound semiconductor containing Si and Ge as constituent elements. Each of first material layers 21 is formed of a thermoelectric conversion material having n-type conductivity which is a first conductivity type. Each of second material layers 22 is formed of a thermoelectric conversion material having p-type conductivity which is a second conductivity type different from the first conductivity type.

Each of first material layers 21 has a strip shape. Each of first material layers 21 includes a first region 28a including a first end portion 28c in the longitudinal direction, and a second region 28b including a second end portion 28d opposite to first end portion 28c in the longitudinal direction. A direction in which a line connecting first region 28a and second region 28b extends is the longitudinal direction of each of first material layers 21 having the strip shape.

First material layers 21 are disposed on first main surface 13b of support film 13. First material layers 21 are disposed so as to be accommodated in region 15 having a rectangular shape indicated by a two-dot chain line in FIG. 1. First material layers 21 are disposed so as to be spaced apart from each other. Except for first material layers 21a, 21b, 21c, and 21d, each of first material layers 21 is disposed such that the longitudinal direction thereof is parallel to the X direction or the Y direction. Except for first material layers 21a, 21b, 21c, and 21d, each of first material layers 21 are disposed in such a manner as to extend in a direction from each side of region 15 having a square shape toward an opposite side of region 15 (in such a manner that the longitudinal direction is parallel to the direction). Each of first material layers 21 is disposed such that first region 28a is located closer to inner edge 16a of heat sink 14 and second region 28b is located closer to outer edge 23a of infrared absorbing film 23 as viewed in the Z direction.

Thermoelectric-conversion material section 12 includes an insulating film 26. For example, $SiO_2$ is selected as a material of insulating film 26. Insulating film 26 is disposed on first material layers 21 in portions where first material layers 21 are disposed, and is disposed on first main surface 13b of support film 13 in portions where first material layers 21 are not disposed. Insulating film 26 is disposed so as not to cover first region 28a and second region 28b of each of first material layers 21.

Each of second material layers 22 has a strip shape as in first material layers 21. Each of second material layers 22 includes a third region 29a including a third end portion 29c in the longitudinal direction and a fourth region 29b including a fourth end portion 29d opposite to third end portion 29c in the longitudinal direction. A direction in which a line connecting third region 29a and fourth region 29b extends is the longitudinal direction of each of second material layers 22 having the strip shape.

Second material layers 22 are disposed so as to be accommodated in region 15 having the rectangular shape indicated by a two-dot chain line in FIG. 1, in the same manner as the arrangement of first material layers 21. Each of second material layers 22 is disposed such that the longitudinal direction thereof is inclined with respect to the X direction or the Y direction. Second material layers 22 are disposed on a portion of first main surface 13b of support film 13, on a portion of insulating film 26, and on a portion of each of first material layers 21. Each of second material layers 22 is disposed such that third region 29a is located closer to inner edge 16a of heat sink 14 and fourth region 29b is located closer to outer edge 23a of infrared absorbing film 23 as viewed in the thickness direction of support film 13.

First material layers 21 and second material layers 22 are alternately connected to each other, except for first region 28a connected to first electrode 24 and third region 29a connected to second electrode 25. Specifically, the arrangement shown on the right-hand side of FIG. 1 is used to illustrate the configuration. First region 28a of each of first material layers 21 is connected to third region 29a of one of second material layers 22 which is adjacent to respective first material layers 21 in a clockwise direction. Second region 28b of each of first material layers 21 is connected to fourth region 29b of one of second material layers 22 which is adjacent to respective first material layers 21 in a counterclockwise direction. In first material layers 21 and second material layers 22, except for first region 28a and third region 29a which are connected to first electrode 24 and second electrode 25, respectively, second region 28b and fourth region 29b are connected to each other, and first region 28a and third region 29a are connected to each other. That is, each of first material layers 21 is paired with one of second material layers 22, and first material layers 21 and second material layers 22 which are adjacent to each other are alternately connected in series to each other electrically in regions including end portions thereof. In the present embodiment, third region 29a is disposed on first region 28a and is in ohmic contact with first region 28a. Fourth region 29b is disposed on second region 28b and is in ohmic contact with second region 28b. A polarity of a voltage generated in first region 28a including first end portion 28c of each of first material layers 21 and a polarity of a voltage generated in third region 29a including third end portion 29c of each of second material layers 22 are opposite to each other with respect to a direction of a temperature gradient generated when optical sensor 11a, specifically, infrared absorbing film 23 is irradiated with light.

Among first material layers 21 and second material layers 22 alternately connected to each other, an endmost one of first material layers 21 is connected to first electrode 24 in first region 28a. Among first material layers 21 and second material layers 22 alternately connected to each other, an endmost one of second material layers 22 is connected to second electrode 25 in third region 29a.

Infrared absorbing film 23 converts an infrared ray into heat. Carbon (C) is selected as a material of infrared absorbing film 23, for example.

Infrared absorbing film 23 is disposed in a region surrounded by inner edge 16a of heat sink 14 as viewed in the Z direction. In the present embodiment, as viewed in the Z direction, outer edge 23a of infrared absorbing film 23 has a square shape. Infrared absorbing film 23 is disposed such that a center of the square shape formed by outer edge 23a of infrared absorbing film 23 and a center of the square shape formed by inner edge 16a of heat sink 14 overlap each other.

Infrared absorbing film 23 is disposed so as to form a temperature difference in each of first material layers 21 in longitudinal directions, specifically, between first region 28a and second region 28b. In addition, infrared absorbing film 23 is disposed so as to form a temperature difference in each of second material layers 22 in longitudinal directions, specifically, between third region 29a and fourth region 29b. In the present embodiment, infrared absorbing film 23 is disposed so as to expose first region 28a and third region 29a and to cover second region 28b and fourth region 29b. That is, second region 28b and fourth region 29b overlap infrared absorbing film 23 as viewed in the Z direction. First region 28a and third region 29a are not covered with infrared absorbing film 23. First region 28a and third region 29a overlap heat sink 14 as viewed in the Z direction. First material layers 21 and second material layers 22 are thermally connected to infrared absorbing film 23 so as to form a temperature difference in each of first material layers 21 in longitudinal directions and each of second material layers 22 in longitudinal directions.

Each of first material layers 21 converts a temperature difference (thermal energy) between first region 28a and second region 28b into electric energy. Each of second material layers 22 converts a temperature difference (thermal energy) between third region 29a and fourth region 29b into electric energy. A temperature difference is formed in each of first material layers 21 in longitudinal directions and each of second material layers 22 in longitudinal directions. Thermoelectric-conversion material section 12 converts the temperature difference (thermal energy) into electric energy by using first material layers 21 and second material layers 22 which have the above configurations. Optical sensor 11a can efficiently utilize the temperature difference formed by infrared absorbing film 23 and heat sink 14 to detect an infrared ray.

The configurations of first material layers 21 and second material layers 22 will be described. Each of first material layers 21 is formed of a first phononic structure having a large number of pores 31. That is, each of first material layers 21 has the first phononic structure having a large number of pores 31. In addition, each of second material layers 22 is formed of a first phononic structure having a large number of pores 31. That is, each of second material layers 22 has the first phononic structure having a large number of pores 31. In the first embodiment, each of first material layers 21 and second material layers 22 has the first phononic structure in the entire surface. That is, as viewed in the Z direction, first overlapping portions of first material layers 21 overlapping infrared absorbing film 23 have the first phononic structure. Second overlapping portions of second material layers 22 overlapping infrared absorbing film 23 as viewed in the Z direction have the first phononic structure. A large number of pores 31 means that pores 31 have an surface density of 25 $\mu m^{-2}$ to 2500 $\mu m^{-2}$.

Figure 5:
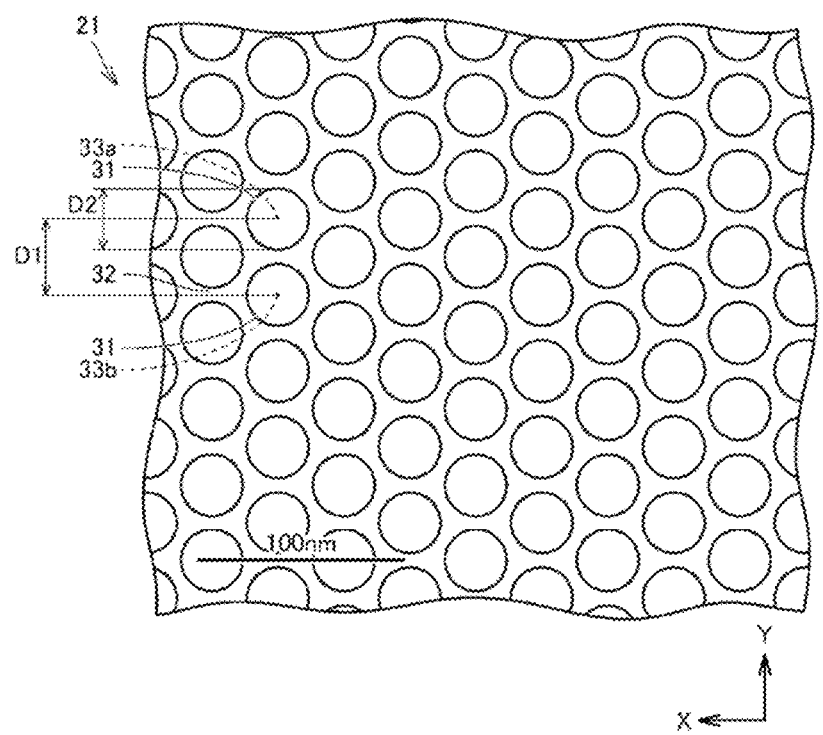
FIG. 5 is an enlarged schematic view of a portion of first material layers formed of a first phononic structure.

FIG. 5 is an enlarged schematic view of a portion of first material layers 21 formed of the first phononic structure. FIG. 5 is a schematic plan view of first material layers 21 as viewed in the Z direction. In the schematic view shown in FIG. 5, an outer shape of each of pores 31 is indicated as a perfect circle for ease of understanding, but the outer shape of each of pores 31 is not limited to a strict perfect circle, and may be an ellipse or a polygon. Referring also to FIG. 5, each of first material layers 21 is configured to be a strip-shaped member in which a large number of pores 31 penetrating in the Z direction are formed at intervals. First material layers 21 can be formed, for example, by forming a resist pattern and vapor-depositing an evaporation material. This will be described later. The same applies to the first phononic structure forming second material layers 22.

A length D1 representing a pitch interval of pores 31 shown in FIG. 5 is 20 nm to 1200 nm. In the present embodiment, length D1 representing the pitch interval of pores 31 is 40 nm. Length D1 representing the pitch interval of pores 31 is an interval between centers 33a and 33b of adjacent pores 31. A length D2 representing a diameter of pores 31 shown in FIG. 5 is 15 nm to 200 nm. In the present embodiment, length D2 representing the diameter of pores 31 is 15 nm.

A difference between length D1 representing the pitch interval of pores 31 and length D2 representing the diameter of pores 31 is 5 nm to 500 nm. The difference between length D1 and length D2 is preferably 10 nm to 200 nm. This will be described later.

A specific configuration of support film 13 will be described below. Support film 13 includes a first portion 19a having a second phononic structure having a large number of pores and a second portion 19b without the second phononic structure. In the first embodiment, first portion 19a is disposed in contact with first material layers 21 and second material layers 22. In the first embodiment, second portion 19b is disposed around first portion 19a. Specifically, first portion 19a is a portion indicated by region 15 shown in FIG. 1 as viewed in the Z direction. Support film 13 is an insulating film. A material of support film 13 is, for example, $SiO_2$ or SiN. Support film 13 has a thickness of 200 nm to 2000 nm.

First portion 19a is formed of the second phononic structure having a large number of pores. That is, first portion 19a of support film 13 has the second phononic structure having a large number of pores. Since a configuration of the second phononic structure is the same as the configuration of the first phononic structure described above, description thereof will be omitted.

Optical sensor 11a includes an underlying film 20 disposed between thermoelectric-conversion material section 12 and infrared absorbing film 23. Underlying film 20 is a Si (silicon)-based insulating film, for example, $SiO_2$ or SiN. Underlying film 20 has a thickness T shown in FIG. 4 of 10 nm to 50 nm.

Figure 6:
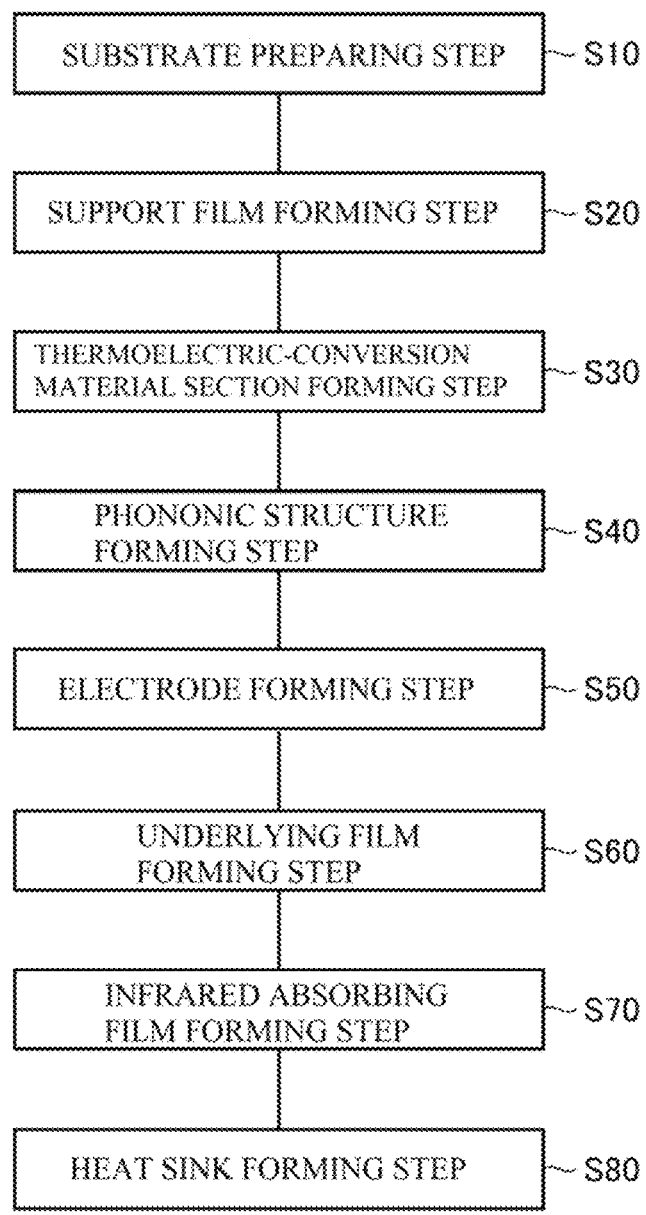
FIG. 6 is a flow chart illustrating exemplary steps in a method of manufacturing the optical sensor according to the first embodiment.

A method of manufacturing optical sensor 11a according to the first embodiment will be briefly described. FIG. 6 is a flow chart illustrating exemplary steps in a method of fabricating optical sensor 11a according to the first embodiment. Referring to FIG. 6, in the method of manufacturing optical sensor 11a in the first embodiment, a substrate preparing step is performed as a step S10. In this step S10, first, a flat plate-like substrate which is formed of Si and serves as a base member of heat sink 14 is prepared.

Next, a support film forming step is performed as a step S20. In this step S20, a $SiO_2$ film is formed on the substrate. In this case, for example, an evaporation material for $SiO_2$ is vapor-deposited on the substrate.

Thereafter, as a step S30, a thermoelectric-conversion material section forming step is performed. In this step S30, thermoelectric-conversion material section 12 is formed on support film 13. Specifically, for example, first material layers 21, a layer of insulating film 26, and second material layers 22 are formed in this order. For forming each of layers, for example, resist coating, photolithography, vapor deposition, and lift-off is employed.

Next, as a step S40, a phononic structure forming step is performed. In this step S40, both the first phononic structure included in first material layers 21 and second material layers 22 and the second phononic structure included in support film 13 are formed. In this case, a phononic structure is drawn with EB (ion beam) to form a resist pattern. In this case, second portion 19b of support film 13 is covered with a mask. Then, dry etching using a fluorine-based gas such as $CHF_3$ or $CF_4$ is performed to form the first phononic structure and the second phononic structure. Thereafter, the mask covering second portion 19b is removed.

Thereafter, an electrode forming step is performed as a step S50. In this step S50, first electrode 24 and second electrode 25 are formed on the substrate. In this case, first electrode 24 and second electrode 25 are formed such that first region 28a of an endmost one of first material layers 21 is in contact with first electrode 24, and third region 29a of an endmost one of second material layers 22 is in contact with second electrode 25.

Next, as a step S60, an underlying film forming step is performed. In this step S60, underlying film 20 is formed on first material layers 21 and second material layers 22 in which the first phononic structure is formed, and on first portion 19a of support film 13 in which the second phononic structure is formed. Forming underlying film 20 allows infrared absorbing film 23, which is to be formed later, to be securely held on thermoelectric-conversion material section 12. Underlying film 20 is formed by vapor deposition of $SiO_2$ using a evaporation material in such a manner that the substrate is placed so as to be inclined by a high angle, for example, 45° or more, with respect to a direction in which the evaporation material is ejected. In this manner, underlying film 20 can be efficiently formed on the first phononic structure and the second phononic structure.

Thereafter, an infrared absorbing film forming step is performed as a step S70. In this step S70, infrared absorbing film 23 is formed on underlying film 20 by vapor deposition or the like.

Finally, as a step S80, a heat sink forming step is performed. In this step S80, anisotropic etching is performed on the substrate to form recess 16. In this manner, optical sensor 11a having the above-described configuration is obtained.

According to optical sensor 11a having such a configuration, first material layers 21 and second material layers 22 are formed of the first phononic structure having a large number of pores 31. According to such a configuration, the thermal conductivities of first material layers 21 and second material layers 22 can be reduced. In this manner, the thermal conductance is reduced to increase the sensitivity while the resistances and the contact resistances of first material layers 21 and second material layers 22 themselves can be properly balanced to reduce the noise. As a result, according to such optical sensor 11a, the noise equivalent power can be further reduced.

In the present embodiment, support film 13 is formed of the second phononic structure having a large number of pores. Therefore, it is possible to reduce the thermal conductivity of support film 13 in addition to thermal conductivities of first material layers 21 and second material layers 22. Thus, the sensitivity can be increased. As a result, according to such an optical sensor, the noise equivalent power can be reduced.

In the present embodiment, the pitch interval of pores 31 forming the first phononic structure is 20 nm to 1200 nm. In this manner, the thermal conductivity in the first phononic structure can be more reliably reduced. Therefore, the sensitivity of optical sensor 11a can be increased to further reduce the noise equivalent power.

In the present embodiment, the diameter of pores 31 forming the first phononic structure is 15 nm to 200 nm. In this manner, the thermal conductivity in the first phononic structure can be more reliably reduced. Therefore, the sensitivity of optical sensor 11a can be increased to further reduce the noise equivalent power.

In the present embodiment, optical sensor 11a further includes underlying film 20 disposed between thermoelectric-conversion material section 12 and infrared absorbing film 23. Therefore, the first phononic structure can be easily formed in first material layers 21 and second material layers 22, so that productivity can be improved.

In the present embodiment, the thickness of underlying film 20 is 10 nm to 50 nm. Therefore, both reduction in the noise equivalent power of optical sensor 11a and good productivity thereof can be achieved more reliably.

In the present embodiment, the pitch interval of pores 31 and the diameter of pores 31 forming the first phononic structure are the same as the pitch interval of the pores and the diameter of the pores forming the second phononic structure, respectively. In this manner, after support film 13, first material layers 21, and second material layers 22 are formed, the first phononic structure and the second phononic structure can be formed at a time. Therefore, productivity can be improved.

In the present embodiment, the difference between length D1 and length D2 is 5 nm to 500 nm, when length D1 is the pitch interval of pores 31 forming the first phononic structure and length D2 is the diameter of pores 31 forming the first phononic structure. In this manner, the thermal conductance is reduced to increase the sensitivity while the resistances and the contact resistances of first material layers 21 and second material layers 22 themselves can be properly balanced to reduce the noise. As a result, according to such optical sensor 11a, the noise equivalent power can be further reduced.

Second Embodiment

Figure 7:
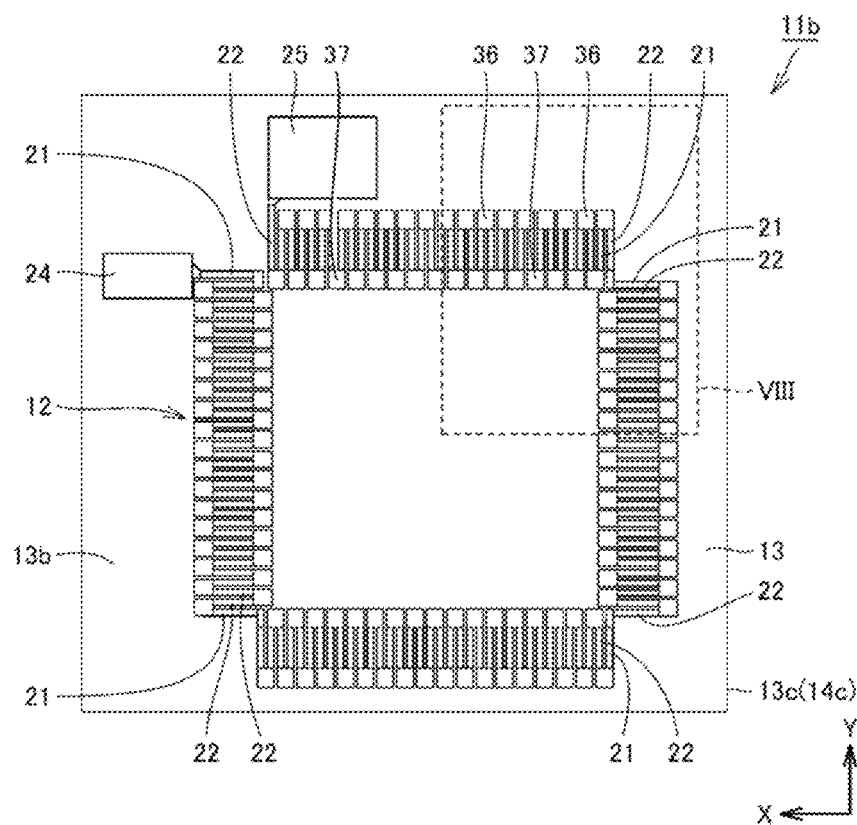
FIG. 7 is a schematic plan view of an appearance of an optical sensor in a second embodiment.
Figure 8:
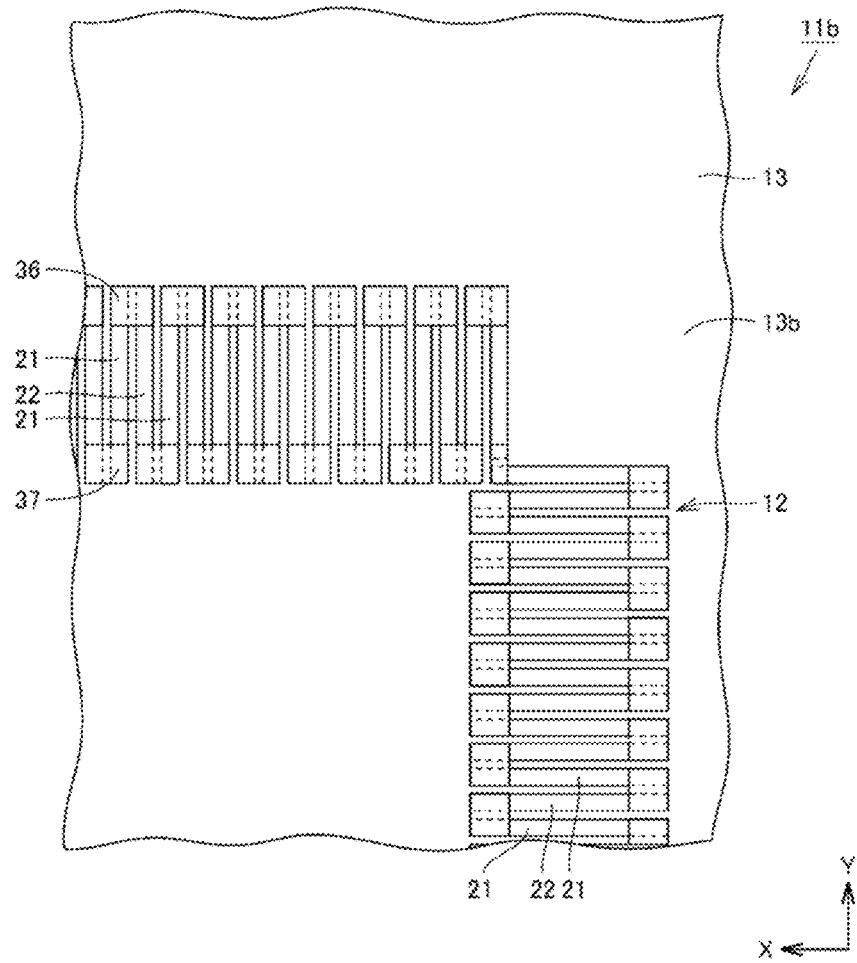
FIG. 8 is an enlarged schematic plan view of an area VIII of the optical sensor shown in FIG. 7.

A second embodiment which is another embodiment will be described below. FIG. 7 is a schematic plan view of an appearance of an optical sensor according to the second embodiment. FIG. 8 is an enlarged schematic plan view of an area VIII of the optical sensor shown in FIG. 7. For ease of understanding, an infrared absorbing film and an insulating film are omitted from FIGS. 7 and 8. FIG. 7 corresponds to FIG. 1. The optical sensor in the second embodiment substantially has the same configuration as that in the first embodiment, and has the same effect. However, the optical sensor in the second embodiment is different from that in the first embodiment in the configurations of the first material layers and the second material layers.

Referring to FIGS. 7 and 8, unlike optical sensor 11a in the first embodiment, first material layers 21 and second material layers 22 included in an optical sensor 11b in the second embodiment are not disposed so as to partially overlap each other in the thickness direction, but are disposed on the same plane, specifically, on support film 13. Strip-shaped first material layers 21 and strip-shaped second material layers 22 are disposed on support film 13 such that respective longitudinal directions are in parallel to the X direction or the Y direction. First material layers 21 and second material layers 22 are disposed so as to be alternately spaced apart from each other.

Thermoelectric-conversion material section 12 includes a third material layer 36 and a third material layer 37 formed of a metal. Examples of the metal forming third material layer 36 and third material layer 37 include nickel (Ni), tungsten (W), molybdenum (Mo), titanium (Ti), gold (Au), palladium (Pd), germanium (Ge), hafnium (Hf), and aluminum (Al). Third material layer 36 is disposed across first region 28a and third region 29a adjacent to each other at an outer end of each of first material layers 21 and an outer end of each of second material layers 22 so as to be in ohmic contact with first region 28a and third region 29a. Third material layer 36 is disposed so as to cover first region 28a, third region 29a, a portion of a side surface of first region 28a, and a portion of a side surface of third region 29a. Third material layer 37 is disposed across second region 28b and fourth region 29b adjacent to each other at an inner end of each of first material layers 21 and an inner end of each of second material layers 22 so as to be in ohmic contact with second region 28b and fourth region 29b. First region 28a and third region 29a overlap heat sink 14 as viewed in the Z direction. Second region 28b and fourth region 29b overlap infrared absorbing film 23 as viewed in the Z direction. First material layers 21 and second material layers 22 are formed of the first phononic structure.

In this manner, the sensitivity is increased and the noise is reduced while the noise equivalent power can be reduced.

Third Embodiment

Figure 9:
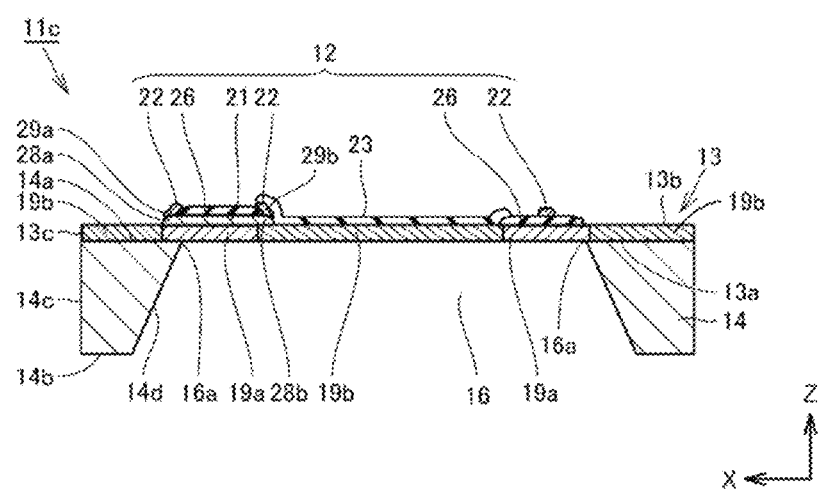
FIG. 9 is a schematic cross-sectional view of an optical sensor according to a third embodiment.

A third embodiment which is another embodiment will be described below. FIG. 9 is a schematic cross-sectional view of an optical sensor according to the third embodiment. The optical sensor in the third embodiment substantially has the same configuration as that in the first embodiment, and has the same effect. However, the optical sensor in the third embodiment is different from that in the first embodiment in the configuration of the first phononic structure formed in first material layers 21 and second material layers 22 and the configuration of the second phononic structure formed in support film 13.

Referring to FIG. 9, the third embodiment will be described below. Each of first material layers 21 includes a portion having the first phononic structure and a portion without the first phononic structure. Each of second material layers 22 includes a portion having the first phononic structure and a portion without the first phononic structure. In both first material layers 21 and second material layers 22, the portion having the first phononic structure is formed so as not to overlap infrared absorbing film 23, and the portion without first phononic structure is formed so as to overlap infrared absorbing film 23. In the third embodiment, the first overlapping portions of first material layers 21 overlapping infrared absorbing film 23 as viewed in the Z direction do not have the first phononic structure. As viewed in the Z direction, the second overlapping portions of second material layers 22 overlapping infrared absorbing film 23 do not have the first phononic structure. Support film 13 includes first portion 19a having the second phononic structure and second portion 19b without second phononic structure. First portion 19a is disposed between second portion 19b disposed at a center and second portion 19b disposed at a periphery. That is, support film 13 has the second phononic structure in a portion that does not overlap infrared absorbing film 23 and outer edge 13c, that is, in first portion 19a, as viewed in the Z direction. As viewed in the Z direction, second portion 19b of support film 13 overlapping infrared absorbing film 23 does not have the first phononic structure.

In this manner, the sensitivity is increased and the noise is reduced while the noise equivalent power can be reduced.

Figure 10:
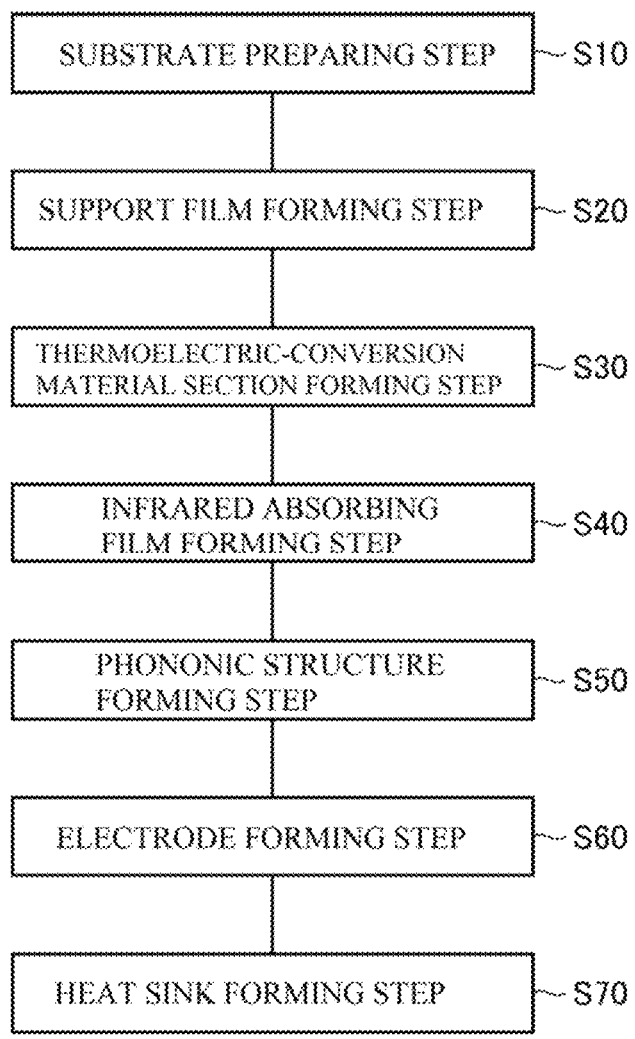
FIG. 10 is a flow chart illustrating exemplary steps in a method of manufacturing the optical sensor according to the third embodiment.

Optical sensor 11c described in the third embodiment is manufactured by the following steps, for example. FIG. 10 is a flow chart illustrating exemplary steps in a method of manufacturing optical sensor 11c according to the third embodiment. Referring to FIG. 10, in the method of manufacturing optical sensor 11c in the third embodiment, substrate preparing step S10, support film forming step S20, and thermoelectric-conversion material section forming step S30 are performed as the steps. Thereafter, an infrared absorbing film forming step S41 is performed. That is, infrared absorbing film 23 is formed on thermoelectric-conversion material section 12. Thereafter, a phononic structure forming step S51 is performed. In this case, a region where infrared absorbing film 23 is disposed is covered with a mask to form the first phononic structure and the second phononic structure. After an electrode forming step S61 is performed, a heat sink forming step S71 is performed.

In this manner, optical sensor 11c according to the third embodiment is manufactured. According to such a manufacturing method, optical sensor 11c according to the third embodiment can be efficiently manufactured without forming underlying film 20. Infrared absorbing film forming step S41 may be performed between electrodes forming step S61 and heat sink forming step S71. In this case, in phononic structure forming step S51, for example, a resist pattern is formed in a region where infrared absorbing film 23 is to be formed in a later step. In this manner, it is possible to prevent the first phononic structure and the second phononic structure from being formed in portions overlapping infrared absorbing film 23 as viewed in the Z direction.

A relationship between a sensitivity and a difference between a length D1 and length D2 in optical sensor 11a of the first embodiment, optical sensor 11c of the third embodiment, and the optical sensor according to the present disclosure in which the first phononic structure is formed only in first material layers 21 and second material layers 22 and the second phononic structure is not formed in support film 13 will be described below.

Figure 11:
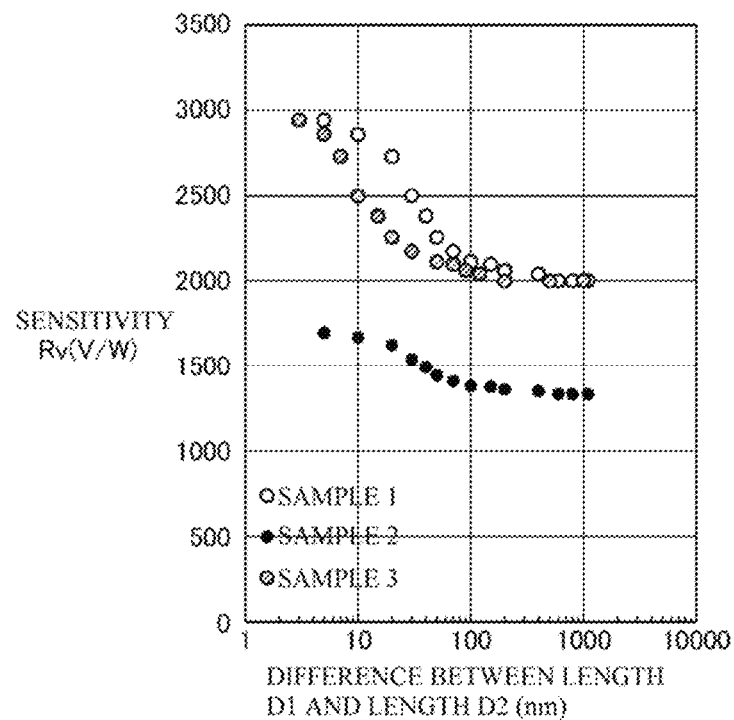
FIG. 11 is a graph showing a relationship between a sensitivity of an optical sensor and a difference between a length D1 and a length D2.

FIG. 11 is a graph showing the relationship between the sensitivity of the optical sensor and the difference between length D1 and length D2. In FIG. 11, a horizontal axis represents the difference (nm) between length D1 and length D2, and a vertical axis represents the sensitivity Rv (V/W). In FIG. 11, sample 1 represents the optical sensor in the first embodiment, sample 2 represents the optical sensor in the third embodiment, and sample 3 represents the optical sensor in which the first phononic structure is formed only in first material layers 21 and second material layers 22 and the second phononic structure is not formed in support film 13. The same applies to FIGS. 12, 13 and 14.

Referring to FIG. 11, as the difference between length D1 and length D2 increases, the sensitivity increases in any of the samples.

Figure 12:
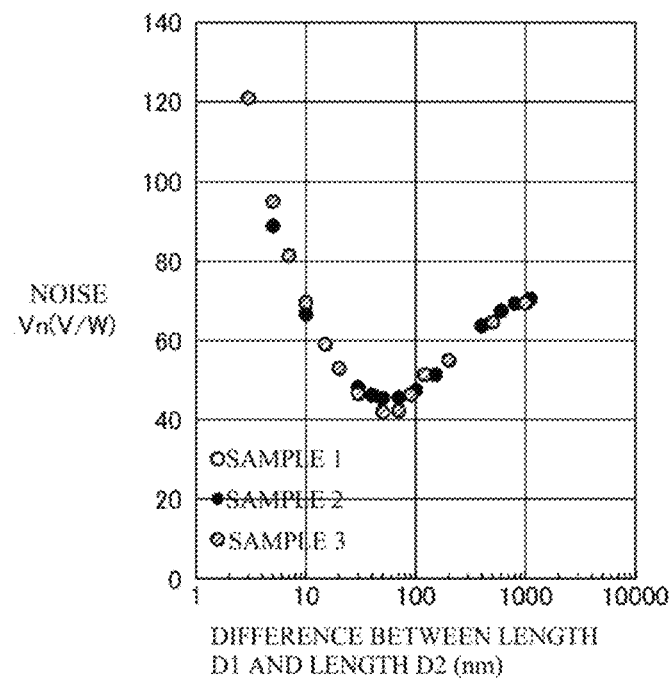
FIG. 12 is a graph showing a relationship between a noise of an optical sensor and the difference between length D1 and length D2.

FIG. 12 is a graph showing a relationship between a noise of the optical sensor and the difference between length D1 and length D2. In FIG. 12, a horizontal axis represents the difference (nm) between length D1 and length D2, and a vertical axis represents the noise Vn (V/W).

Referring to FIG. 12, as the difference between length D1 and length D2 increases, contact resistances increase, but resistances of the first material layers and the second material layers themselves decrease, so that a graph showing the relationship between the noise and the difference between length D1 and length D2 in each of the samples has a downward convex shape within a certain range of the difference between length D1 and length D2.

Figure 13:
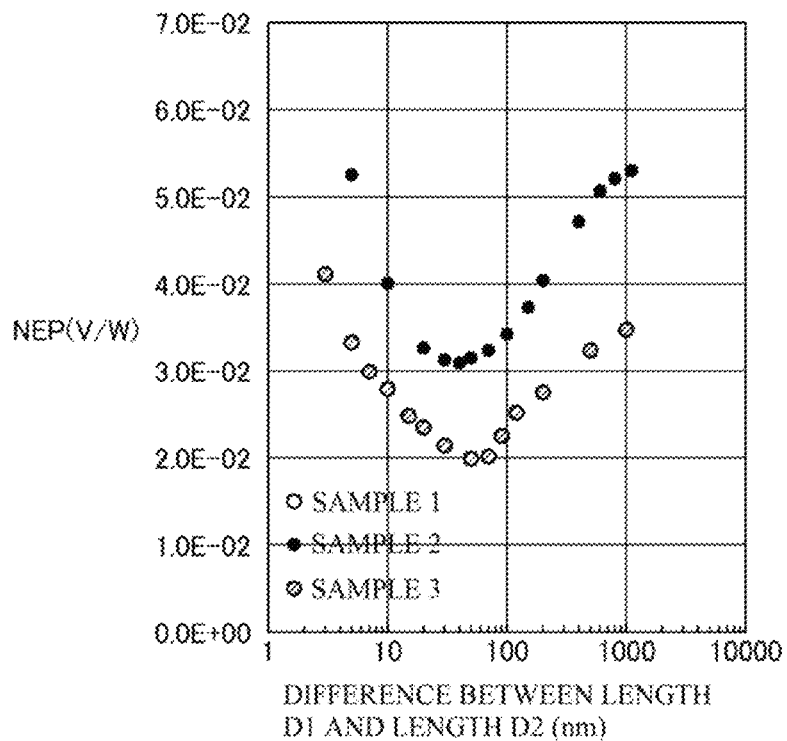
FIG. 13 is a graph showing a relationship between a noise equivalent power (NEP) of an optical sensor and the difference between length D1 and length D2.

FIG. 13 is a graph showing a relationship between a noise equivalent power (NEP) of the optical sensor and the difference between length D1 and length D2. In FIG. 13, a horizontal axis represents the difference (nm) between length D1 and length D2, and a vertical axis represents the NEP (V/W).

Referring to FIG. 13, since the NEP is derived by noise/sensitivity, the tendency of the graph shown in FIG. 12 is remarkable for the NEP, and the value of NEP becomes small within a certain range of the difference between length D1 and length D2. By setting the difference between length D1 and length D2 to be 5 nm to 500 nm, the value of NEP can be set to be 3.5E-02 or less. Then, the noise equivalent power can be further reduced. Furthermore, by setting the difference between length D1 and length D2 to be 10 nm to 200 nm, the value of NEP can be set to be 3.0E-02 or less. As a result, the noise equivalent power can be further reduced.

Figure 14:
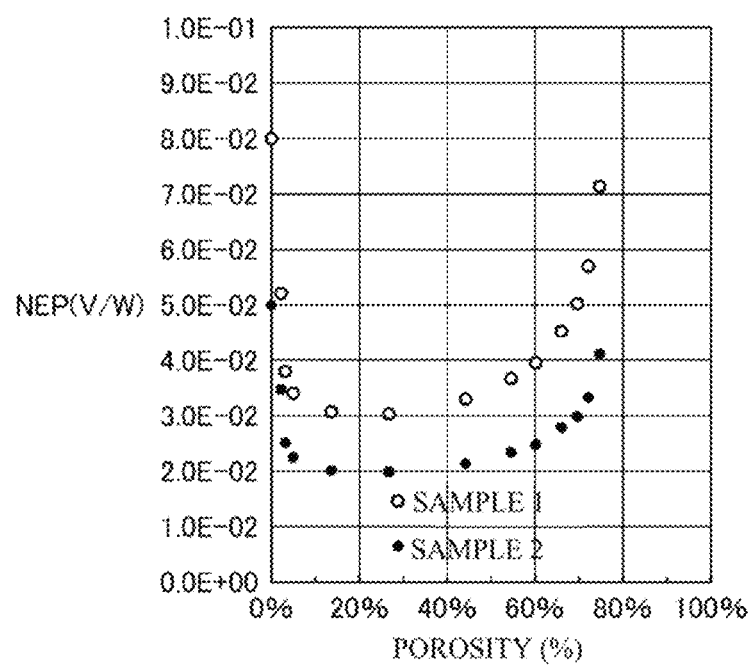
FIG. 14 is a graph showing a relationship between a porosity and an NEP.

FIG. 14 is a graph showing a relationship between a porosity and an NEP. In FIG. 14, a horizontal axis represents the porosity (%), and a vertical axis represents the NEP (V/W). The porosity indicates a ratio of a total volume of through holes to the entire first phononic structure.

Referring to FIG. 14, it is also possible to reduce the NEP within a certain range of the porosity. Specifically, the NEP can be reduced by setting the porosity to be 2% to 72%.

Other Embodiments

In the above-described embodiments, the first material layers, the second material layers or both the first material layers and the second material layers may be formed of SiGe having at least one of a nanocrystal structure having a grain size of 3 nm to 200 nm or an amorphous structure. In this manner, thermoelectric conversion efficiency can be improved. Therefore, the sensitivity can be improved to reduce the noise equivalent power.

The grain size of the crystal was measured by observation of a transmission electron microscope (TEM) image. The observation was performed using JEM-2100F (manufactured by JEOL Ltd.) as an apparatus at an acceleration voltage of 200 kV. A diameter of electronic probe was set to 0.2 nm, and as EDX mapping conditions, the number of pixels was set to 256 pixels×256 pixels, a Dwell time was set to 0.5 ms/pixel, and the number of integrations was set to 15.

The SiGe, which is a constituent material of first material layers 21 and second material layers 22, may be formed as follows. For example, SiGe having an amorphous structure may be subjected to heat treatment at a temperature of, for example, about 500° C. to form a nanocrystal structure in a portion thereof. Also, the SiGe may have a nanocrystal structure or an amorphous structure. In addition, the SiGe may be polycrystal. Such a polycrystalline SiGe is also suitably used in the optical sensor of the present disclosure. A crystallization rate of the polycrystal in the optical sensor of the present disclosure is 99% or more. The crystallization rate was measured in the following manner. HORIBA LabRam HR-PL was used as an apparatus. As measurement conditions, a laser wave length was set to 532 nm and a laser power was set to 2.5 mW. As an analysis condition, a peak around 400 cm$^1$ was analyzed. In the analysis, a Gaussian function and a pseudo-Voigt function were fitted. The Gaussian function G (x) is expressed by the following equation shown in Math. 3.

$$G(x) = A_g \exp\left(-\frac{4\ln 2}{W_g^2}(x-x_g)^2\right) \quad [\text{Math. 3}]$$

The Pseudo-Voigt function F (x) is expressed by the following equation shown in Math. 4.

$$F(x) = A_F \frac{m}{\pi}\left[\frac{W_f}{(x-x_f)^2 + W_f^2}\right] + A_F \frac{1-m}{\sqrt{2\pi}W_f}\exp\left[-\frac{(x-x_f)^2}{2W_f^2}\right] \quad [\text{Math. 4}]$$

In the parameters $A_g$, $W_g$, and $x_g$ of Gaussian function G (x), an initial value of $x_g$ was set to 400 cm$^{-1}$. In the parameters $A_F$, $W_f$, $x_f$, and m of pseudo-Voigt function F (x), an initial value of $x_f$ was set to 380 cm$^{-1}$, and m was set to 0.5. Each of parameters was optimized by the least squares method, and each of the pseudo-Voigt function and the Gaussian function was integrated to obtain an area. The crystallization rate was calculated by an equation of crystallization rate=area derived using the pseudo-Voigt function/(area derived using the pseudo-Voigt function+area derived using the Gaussian function), considering that the area derived using the Gaussian function corresponds to amorphous structure and the area derived using the pseudo-Voigt function corresponds to crystalline structure.

It should be understood that the embodiments disclosed in the present disclosure are merely illustrative and non-restrictive in every respect. The scope of the present disclosure is defined by the claims rather than the description above, and is intended to include any modifications within the scope and meaning equivalent to the claims.

What is claimed is:

1. An optical sensor comprising:
   a support film having a first main surface and a second main surface located opposite to the first main surface in a thickness direction;
   a thermoelectric-conversion material section including a plurality of first material layers and a plurality of second material layers, each of the plurality of first material layers having a strip shape, being formed of SiGe having p-type conductivity, and being configured to convert thermal energy into electric energy, each of the plurality of second material layers having a strip shape, being formed of SiGe having n-type conductivity, and being configured to convert thermal energy into electric energy, the thermoelectric-conversion material section being disposed on the first main surface;
   a heat sink disposed on the second main surface; and
   a light absorbing film disposed so as to form a temperature difference in each first material layer of the plurality of first material layers in longitudinal directions and each second material layer of the plurality of second material layers in longitudinal directions as viewed in a direction perpendicular to the first main surface, and configured to convert received light into thermal energy,
   wherein the plurality of first material layers and the plurality of second material layers are formed of a first phononic structure having a large number of pores,
   wherein the support film includes a first portion formed of a second phononic structure having a large number of pores and a second portion without the second phononic structure, and
   wherein at least a part of the first portion is in contact with the plurality of first material layers and the plurality of second material layers.

2. The optical sensor according to claim 1, wherein, when a pitch interval of the pores forming the first phononic structure is a length D1 and a diameter of the pores forming the first phononic structure is a length D2, a difference between the length D1 and the length D2 is 5 nm to 500 nm.

3. The optical sensor according to claim 2, wherein a difference between the length D1 and the length D2 is 10 nm to 200 nm.

4. The optical sensor according to claim 1, wherein a pitch interval of the pores forming the first phononic structure is 20 nm to 1200 nm.

5. The optical sensor according to claim 1, wherein a diameter of the pores forming the first phononic structure is 15 nm to 200 nm.

6. The optical sensor according to claim 1, further comprising an underlying film disposed between the thermoelectric-conversion material section and the light absorbing film.

7. The optical sensor according to claim 6, wherein a thickness of the underlying film is 10 nm to 50 nm.

8. The optical sensor according to claim 1, wherein a pitch interval of the pores and a diameter of the pores forming the first phononic structure are same as a pitch interval of the pores and a diameter of the pores forming the second phononic structure, respectively.

9. The optical sensor according to claim 1, wherein the SiGe has at least one of a nanocrystal structure having a grain size of 3 nm to 200 nm or an amorphous structure.

10. The optical sensor according to claim 1, wherein the SiGe is a polycrystal.

11. The optical sensor according to claim 1, wherein first overlapping portions of the plurality of first material layers overlapping the light absorbing film, second overlapping portions of the plurality of second material layers overlapping the light absorbing film, or both the first overlapping portions and the second overlapping portions are formed of the first phononic structure.

12. The optical sensor according to claim 1, wherein first overlapping portions of the plurality of first material layers overlapping the light absorbing film and second overlapping portions of the plurality of second material layers overlapping the light absorbing film do not have the first phononic structure.

13. The optical sensor according to claim 1, wherein a pitch interval of the pores forming the first phononic structure is greater than 800 nm to 1200 nm.

14. The optical sensor according to claim 1, wherein a pitch interval of the pores forming the second phononic structure is uniform.

15. The optical sensor according to claim 1, wherein the SiGe has a nanocrystal structure having a grain size of greater than 50 nm to 200 nm or an amorphous structure.

16. The optical sensor according to claim 1, wherein the second portion of the support film surrounds the first portion of the support film.

17. The optical sensor according to claim 1, wherein the first portion of the support film underlies the light absorbing film.

18. The optical sensor according to claim 1, wherein:
the second portion of the support film includes a central second portion at a center of the optical sensor and a peripheral portion at a periphery of the optical sensor, and
the first portion of the support film is disposed between the central second portion and the peripheral second portion.

* * * * *